United States Patent [19]

Yasuda et al.

[11] Patent Number: 4,570,091
[45] Date of Patent: Feb. 11, 1986

[54] OUTPUT BUFFER CIRCUIT

[75] Inventors: Hiroshi Yasuda, Tokyo; Kiyofumi Ochii, Yokohama, both of Japan

[73] Assignee: Tokyo Shibaura Denki Kabushiki Kaisha, Japan

[21] Appl. No.: 592,717

[22] Filed: Mar. 23, 1984

[30] Foreign Application Priority Data

Mar. 31, 1983 [JP] Japan .................................. 58-56028

[51] Int. Cl.⁴ .................. H03K 17/04; H03K 17/687; H03K 19/096; H03K 5/153
[52] U.S. Cl. .............................. 307/583; 307/246; 307/451; 307/463; 307/473; 307/270; 307/530; 307/518
[58] Field of Search ............... 307/246, 448, 449, 451, 307/452, 453, 463, 473, 475, 270, 582–585, 530, 517, 518

[56] References Cited

U.S. PATENT DOCUMENTS

| | | | |
|---|---|---|---|
| 3,909,631 | 9/1975 | Kitagawa | 307/530 X |
| 3,935,476 | 1/1976 | Paluck | 307/440 |
| 4,465,945 | 8/1984 | Yin | 307/473 |
| 4,488,066 | 12/1984 | Shoji | 307/475 X |
| 4,498,021 | 2/1985 | Uya | 307/270 X |

Primary Examiner—Larry N. Anagnos
Attorney, Agent, or Firm—Finnegan, Henderson, Farabow, Garrett & Dunner

[57] ABSTRACT

An output buffer circuit has a data input terminal which receives logic data, load and drive transistors, a driver for selectively turning on the transistors in accordance with the logic value of the logic data, a data output terminal which is connected to a power source terminal of the VDD level through a current path of the load transistor and is grounded through a current path of the drive transistor, and a capacitor connected as a load to the data output terminal. The output buffer circuit further has a transistion detector circuit for generating a pulse signal in response to a change in level of each of address signals, and a preset circuit for supplying, in response to the pulse signal, a charge or discharge current to the capacitor while a voltage at the data output terminal is not at the VDD/2 level.

13 Claims, 8 Drawing Figures

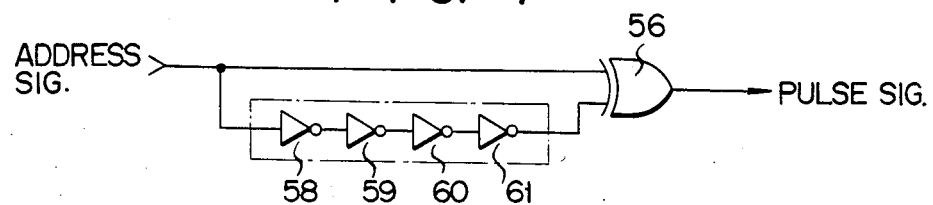
FIG. 4
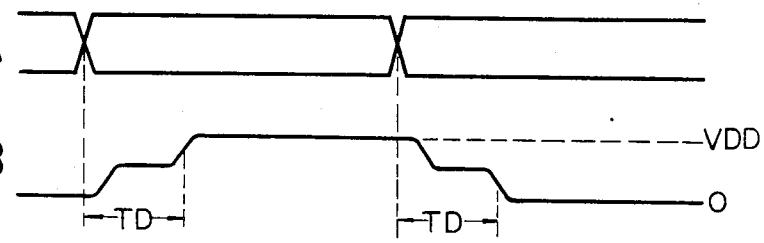
FIG. 5A
FIG. 5B
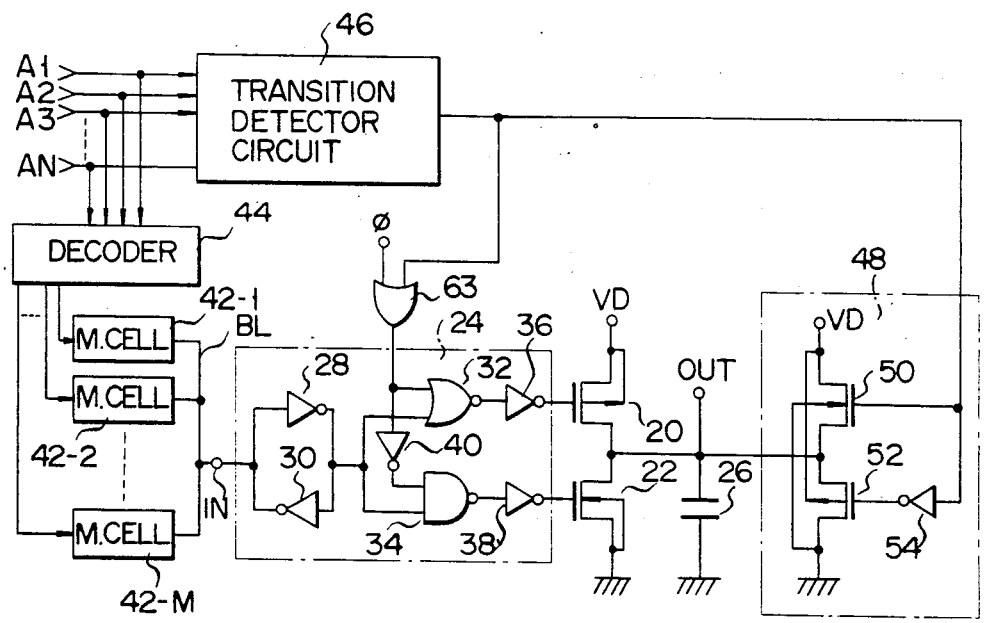
FIG. 6

OUTPUT BUFFER CIRCUIT

BACKGROUND OF THE INVENTION

The present invention relates to an output buffer circuit for a high-speed semiconductor logic device such as a semiconductor memory and a microprocessor and, more particularly to an output buffer circuit for generating output data in response to a signal representing that input data will be supplied thereto after a predetermined time has passed.

FIG. 1 is a conventional output buffer circuit for a semiconductor memory. This output buffer circuit has a data input terminal IN connected to output terminals of a plurality of memory cells (not shown) through a bit line, a control terminal $\phi$ which receives a signal for disabling a data output, load and drive transistors 10 and 12, and a driver 14 for controlling the conduction states of the transistors 10 and 12 in accordance with a logic value of data supplied through the terminal IN. The driver 14 is operated to render the transistors 10 and 12 nonconductive while the disable signal is supplied from the terminal $\phi$. A data output terminal OUT of the output buffer circuit is connected through a current path of the transistor 10 to a power source terminal VD to which a voltage VDD (e.g., 5 V) is supplied and which is grounded through a current path of the transistor 12. A capacitor 16 used as a load is connected to the data output terminal OUT. The capacitor 16 has a large capacitance.

Assume that data of logic values "1" and "0" are respectively stored in the first and second memory cells to be selectively accessed in response to an address signal. In this case, as shown in FIG. 2(A), when the address signal is changed to cause data of "1" to be read out from the first memory cell, the data of logic value "1" will be supplied from the first memory cell to the output buffer circuit after a predetermined period of time has passed. Then the transistors 10 and 12 are rendered conductive and nonconductive, respectively, in accordance with the data of logic value "1" to permit a charge current to flow into the capacitor 16. This causes the voltage of the data output terminal OUT to be increased to the VDD level, as shown in FIG. 2(B). Assume next that the address signal is changed to read out the data of "0" from the second memory cell. When the data of logic value "0" is supplied from the second memory cell to the output buffer circuit after a predetermined period of time, the transistors 10 and 12 are respectively rendered nonconductive and conductive. Therefore, a discharge current flows from the capacitor 16, so that the voltage of the data output terminal OUT is decreased to the ground potential level, as shown in FIG. 2(B).

When the charge and discharge currents with respect to the capacitor 16 are small, it takes a long time to change a voltage of the data output terminal OUT. In addition, since the capacitor 16 has a large capacitance, this time interval is mostly occupied by a memory access time TD which starts when the address signal is changed and terminates when a voltage of the capacitor 16 is changed to a level near the VDD or ground level. Therefore, the time TD impairs high-speed readout operation of the memory. The transistors 10 and 12 might have a large driving capacity for increasing the charge and discharge currents. However, this leads to an increase in power consumption.

SUMMARY OF THE INVENTION

It is an object of the present invention to provide a low-power output buffer circuit capable of changing an output voltage at a high speed in accordance with a logic value of input logic data.

In order to achieve the above object of the present invention, there is provided an output buffer circuit comprising first and second power source terminals of which the potentials are respectively set at first and second levels, a data input terminal for receiving logic data, a data output terminal, a capacitor connected to the data output terminal, a first transistor whose current path is connected between the first power source terminal and the data output terminal, a second transistor whose current path is connected between the data output terminal and the second power source terminal, a signal generating circuit for generating a pulse signal, a preset circuit which has first and second switching elements and selectively supplies, in response to an output signal from the signal generating circuit, one of charge and discharge currents with respect to the capacitor through the first or second switching elements to set the potential of the data output terminal at a predetermined level between the first and second levels, the first and second switching elements being turned off when the potential of the data output terminal is set at substantially the predetermined level, and a drive circuit for controlling the conduction states of the first and second transistors in accordance with the logic value of the logic data after the potential of the data output terminal is set at the predetermined level.

BRIEF DESCRIPTION OF THE DRAWINGS

FIG. 4 is a circuit diagram of a transition detector which serves to detect a change in level of a 1-bit address signal;

FIGS. 5A and 5B are timing charts for explaining the operation of the output buffer circuit shown in FIG. 3; and FIG. 6 is a circuit diagram of an output buffer circuit for a semiconductor memory according to another embodiment of the present invention wherein a control signal is supplied to a driver thereof in addition to a pulse signal from the transition detector.

DETAILED DESCRIPTION OF THE PREFERRED EMBODIMENTS

Figure 1:
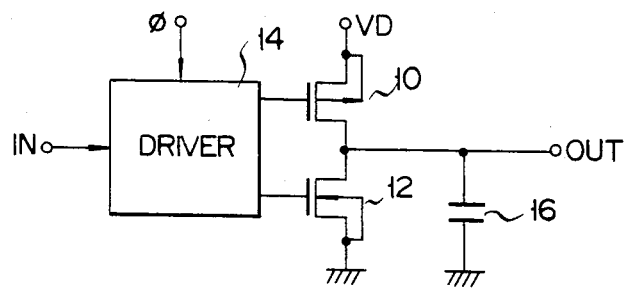
FIG. 1 shows a conventional output buffer circuit.
Figure 2A:
FIGS. 2A and 2B are timing charts for explaining the operation of the output buffer circuit shown in FIG. 1.
Figure 2B:
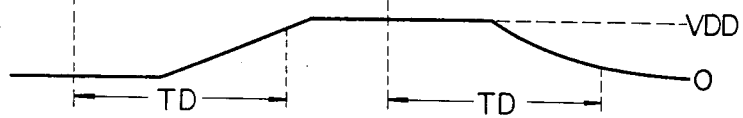
Figure 3:
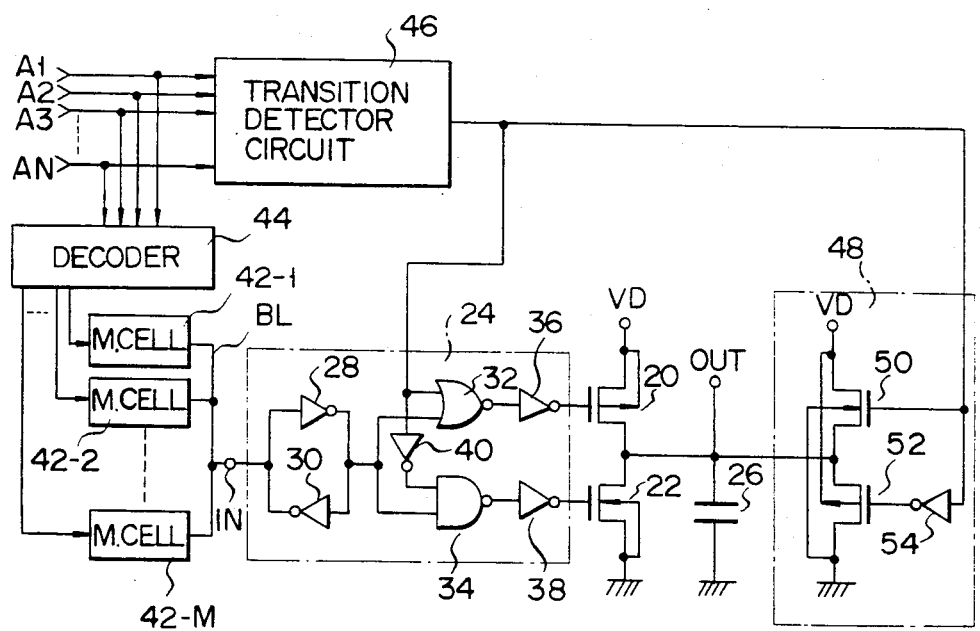
FIG. 3 is a circuit diagram of an output buffer circuit for a semiconductor memory according to an embodiment of the present invention.

FIG. 3 shows an output buffer circuit for a semiconductor memory according to an embodiment of the present invention. The output buffer circuit has n- and p-channel MOS transistors 20 and 22 and a driver 24 for selectively turning on the transistors 20 and 22 in accordance with a logic value of data supplied thereto through a data input terminal IN, as shown in FIG. 3. An output terminal OUT of the output buffer circuit is connected through a current path of the transistor 20 to a power source terminal VD to which a voltage VDD (e.g., 5 V) is supplied, and is grounded through a current path of the transistor 22. One end of a capacitor 26 serving as a load is connected to the data output terminal OUT, and the other end thereof is grounded. The driver 24 includes a latch section and a selector section. The latch section has inverters 28 and 30. The selector section has a 2-input NOR gate 32, a 2-input NAND gate 34, and inverters 36, 38 and 40. The input terminal of the inverter 28 is connected to the data input terminal IN and the output terminal of the inverter 30. The output terminal of the inverter 28 is connected to the input terminal of the inverter 30, the first input terminal of the NOR gate 32, and the first input terminal of the NAND gate 34. The output terminal of the NOR gate 32 is connected to the gate of the p-channel MOS transistor 20 through the inverter 36. The output terminal of the NAND gate 34 is connected to the gate of the n-channel MOS transistor 22 through the inverter 38. The input terminal IN is connected to the output terminals of memory cells 42-1, 42-2, . . . , and 42-M through a bit line BL. Address signals A1, A2, . . . , and AN are supplied to a decoder 44 for specifying read access of one of the memory cells 42-1, 42-2, . . . , and 42-M in response to the address signals A1, A2, . . . , and AN.

The output buffer circuit further comprises a transition detector circuit 46 for detecting a change in address signals A1 to AN and generating a pulse signal which is set at high level (i.e., VDD) for a predetermined period of time, and a preset circuit 48 for presetting a potential at the data output terminal OUT to be an intermediate potential (i.e., VDD/2) of the power source voltage VDD in response to the pulse signal generated from the transition detector circuit 46. The preset circuit 48 has an n-channel MOS transistor 50 whose gate is directly connected to the output terminal of the transition detector circuit 46, and a p-channel MOS transistor 52 whose gate is connected to the output terminal of the transition detector circuit 46 through an inverter 54. The current path of the transistor 50 is connected between the data output terminal OUT and the power source terminal VD. The data output terminal OUT is grounded through the current path of the transistor 52. The transition detector circuit 46 comprises N one-bit transition detectors which respond to the respective address signals A1, A2, . . . , and AN. One of the 1-bit transition detectors is illustrated in FIG. 4. A pulse signal from each 1-bit transition detector is supplied to the preset circuit 48 through an OR gate (not shown). This pulse signal is also supplied to the second input terminal of the NAND gate 34 through the inverter 40 and directly to the second input terminal of the NOR gate 32. The transition detector shown in FIG. 4 has an exclusive OR gate 56 and inverters 58 to 61 constituting a delay circuit. One of the address signals A1 to AN is directly supplied to the first input terminal of the exclusive OR gate 56 and to a second input terminal thereof through a series circuit of the inverters 58 to 61.

The operation of the output buffer circuit according to this embodiment will be schematically described.

In order to read out data from one of the memory cells 42-1, 42-2, . . . , and 42-M, the address signals A1 to AN are updated. When at least one of the address signals A1 to AN changes to select, for example, the memory cell 42-1, as shown in FIG. 5A, the decoder 44 permits the reading operation of the memory cell 42-1, and the transition detector circuit 46 generates a pulse signal (e.g., VDD level) of a predetermined pulse width, for example, corresponding to the delay time of the inverters 58 to 61. The driver makes the transistors 20 and 22 nonconductive when receiving the pulse signal. In this case, when the capacitor 26 is not charged, the potential of the data output terminal OUT is at ground level. The preset circuit 48 changes the potential of the data output terminal OUT to an intermediate level (i.e., VDD/2) of the power source voltage VDD in response to the pulse signal as shown in FIG. 5B. This operation is completed before the readout data from the memory cell 42-1 is sent on the bit line BL. For example, when the data of logic value "1" is read out from the memory cell 42-1, this data is supplied to the input terminal IN and is latched by the latch section of inverters 28 and 30. After the pulse signal falls, the selector section of the driver 24 renders the transistors 20 and 22 conductive and nonconductive, respectively, in accordance with the logic value "1" of the data from the latch section. Therefore, a charge current is supplied to the capacitor 26 through the transistor 20, so that the potential at the data output terminal OUT is increased from the VDD/2 level to the VDD level, as shown in FIG. 5B.

When the address signals A1 to AN are updated to access the memory cell 42-2, as shown in FIG. 5A, the decoder 44 instructs a reading operation to the memory cell 42-2. The transition detector circuit 46 detects change in at least one of the address signals A1 to AN and generates the pulse signal in the same manner as previously described. At this time, the selector section of the driver 24 makes the transistors 20 and 22 nonconductive in response to the pulse signal from the transition detector circuit 46, regardless of the data from the latch section. The preset circuit 48 presets the potential at the data output terminal OUT to an intermediate potential (i.e., VDD/2) of the power source voltage VDD, as shown in FIG. 5B, in response to the pulse signal. In this case, the potential at the terminal OUT is changed from the VDD level to the VDD/2 level. Thereafter, for example, data of logic level "0" is read out from the memory cell 42-2 onto the bit line BL. This data is supplied to the input terminal IN of the output buffer circuit and is latched by the latch section of the inverters 28 and 30 in the driver 24. When the pulse signal from the transition detector circuit 24 becomes low, the selector section of the driver 24 makes the transistors 20 and 22 nonconductive and conductive, respectively, in accordance with the logic value "0" of the data from the latch section. The discharge current is supplied to the capacitor 26 through the transistor 22, so that the potential at the data output terminal OUT changes from the VDD/2 level to the ground level (i.e., 0 V), as shown in FIG. 5B.

The preset circuit 48 will be described more in detail. The sources of the n- and p-channel MOS transistors 50 and 52 are commonly connected to the data output terminal OUT and serve as a common output terminal of the preset circuit 48. A threshold voltage of the MOS transistors 50 and 52 changes in accordance with a change in a source voltage (i.e., a change in voltage at the terminal OUT) due to a back gate biasing effect. The transition detector circuit 46 generates a low level signal (ground level) except for the case wherein the address signals A1 to AN are updated. In this case, the transistors 50 and 52 are held nonconductive. When the transition detector circuit 46 generates a high level signal (VDD level) as a pulse signal, one of the MOS transistors 50 and 52 is selectively turned on, and the other is turned off. In particular, the transistor 50 is turned on during a period while the voltage VOUT at the data output terminal OUT is lower than the VDD/2 level, so that a charge current flows to the capacitor 26. Accordingly, the voltage VOUT at the terminal OUT rises to the VDD/2 level. On the other hand, the transistor 52 is turned on for a period while the output voltage VOUT at the data output terminal OUT is higher than the VDD/2 level, so that the discharge current flows from the capacitor 26. As a result, the voltage VOUT at the data output terminal OUT changes from the VDD level to the VDD/2 level. When the voltage VOUT at the data output terminal OUT is set to be substantially VDD/2 level, the transistors 50 and 52 are both rendered nonconductive.

This operation can be accomplished when the n- and p-channel MOS transistors 50 and 52 satisfy a specific condition given by a mathematical analysis.

A threshold voltage VN of the MOS transistor 50 is given by the following equation:

$$VN = VN0 + KN\sqrt{VOUT} \qquad (1)$$

where
VN0: the threshold voltage of the n-channel MOS transistor when the source potential is set at the ground level
KN: the back gate biasing effect constant of the n-channel MOS transistor which is determined by, for example, the thickness of the gate insulation film and the impurity concentration of the channel region in the substrate.

A threshold voltage VP ($<0$ V) of the MOS transistor 52 is given as follows:

$$|VP| = |VP0| + KP\sqrt{VDD - VOUT} \qquad (2)$$

where
VP0: the threshold voltage of the p-channel MOS transistor when the source potential is set at the VDD level
KP: the back gate biasing effect constant of the p-channel MOS transistor which is determined by, for example, the thickness of the gate insulation film and the impurity concentration of the channel region in the substrate.

While the transition detector 46 is generating the high level signal (VDD level), the gate-source voltage of the MOS transistor 50 is set to be VDD−VOUT. In this case, the conduction condition of the MOS transistor 50 is given as follows:

$$VDD - VOUT \geq VN = VN0 + KN\sqrt{VOUT} \qquad (3)$$

Similarly, the nonconduction condition of the MOS transistor 50 is given as follows:

$$VDD - VOUT \leq VN = VN0 + KN\sqrt{VOUT} \qquad (4)$$

While the transition detector circuit 46 generates the high level signal (VDD level), the gate of MOS transistor 52 is supplied with a voltage of ground level through the inverter 54. For this reason, the gate-source voltage of the MOS transistor 52 is set to be VOUT. In this case, the conduction condition of the MOS transistor 52 is given as follows:

$$VOUT \geq |VP| = |VP0| + KP\sqrt{VDD - VOUT} \qquad (5)$$

Similarly, the nonconduction condition of the MOS transistor 52 is given as follows:

$$VOUT \leq |VP| = |VP0| + KP\sqrt{VDD - VOUT} \qquad (6)$$

Now assume that the potential or voltage VOUT at the data output terminal OUT is set at the ground level. Inequality (3) is satisfied, so that the MOS transistor 50 is rendered conductive. At the same time, inequality (6) is satisfied, so that the MOS transistor 52 is rendered nonconductive. The capacitor 26 receives the charge current through the MOS transistor 50 so as to raise the potential VOUT at the data output terminal OUT to VM1 level. The VM1 level is the voltage VOUT at the terminal OUT when equality is established in inequality (3) and is given as follows:

$$VM1 = VDD - VN0 + KN^2/2 - \qquad (7)$$
$$\sqrt{(VDD - VN0)KN^2 + KN^4/4}$$

If the voltage VM1 satisfies inequality (6), the MOS transistor 52 is held nonconductive until the voltage VOUT at the data output terminal OUT reaches the VM1 level. In this case, the MOS transistor 52 does not influence an increase in voltage VOUT at the data output terminal. The following condition must be satisfied so as to hold the MOS transistor 52 nonconductive while the MOS transistor 50 is rendered conductive:

$$VM1 \leq |VP0| - KP^2/2 + \qquad (8)$$
$$\sqrt{(VDD - |VP0|)KP^2 + KP^4/4}$$

When VM2 is substituted in right-hand side of inequality (8) inequality (8) can be rewritten as follows:

$$VM2 > VM1 \qquad (9)$$

Now assume that the voltage VOUT at the data output terminal OUT is set at the VDD level. Inequality (4) is satisfied so that the MOS transistor 50 is rendered nonconductive. At the same time, inequality (5) is satisfied so that the MOS transistor 52 is rendered conductive. The capacitor 26 then receives the discharge current through the MOS transistor 52, so that the potential VOUT at the data output terminal falls to a VM2 level given as follows:

$$VM2 = |VP0| - KP^2/2 + \sqrt{(VDD - |VP|)KP^2 + KP^4/4} \qquad (10)$$

The condition for holding the MOS transistor 50 in the nonconductive state until the potential VOUT reaches the VM2 level is given as follows:

$$VDD - VM2 \leq VN0 + KN\sqrt{VM2} \qquad (11)$$

The condition for holding the MOS transistor 50 in the nonconductive state while the MOS transistor 52 is held conductive is given as follows:

$$VM2 \geq VDD - VN0 + KN^2/2 - \sqrt{(VDD - VN0)KN^2 + KN^4/4} \quad (12)$$

The right-hand side of inequality (12) corresponds to VM1, so that inequality (12) can be rewritten as follows:

$$VM2 \geq VM1 \quad (13)$$

When inequalities (9) and (13) are simultaneously established, the following equation is established:

$$VM1 = VM2 \quad (14)$$

The MOS transistors 50 and 52 are respectively rendered nonconductive and conductive while the voltage VOUT at the data output terminal OUT changes from the VDD level to the VM level (i.e., VDD/2). The MOS transistors 50 and 52 are respectively rendered conductive and nonconductive while the voltage VOUT changes from the ground level to the VM level (i.e., VDD/2). When inequalities (10) and (12) are substituted in equation (14), the following equation is derived:

$$VM = VDD - VN0 + KN^2/2 - \quad (15)$$

$$\sqrt{(VDD - VN0)KN^2 + KN^4/4} \ (= VM1)$$

$$= |VP0| - KN^2/2 + \sqrt{(VDD - |VP|)KP^2 + K^4/4}$$
$$(= VM2)$$

When KP and KN are defined to safisfy equation (15), the preset circuit 48 sets a voltage at the data output terminal OUT to be an intermediate potential VM between the power source voltage VDD and the ground level while the transition detector circuit 46 generates the pulse signal in response to updating of the address signals A1 to AN. For example, each of KP and KN is given in accordance with the impurity concentration in the channel region of the p-channel and n-channel MOS transistors. The impurity concentration is determined by the ion-implantation condition in the channel region. Therefore, the n- and p-channel MOS transistors 50 and 52 are formed under the ion-implantation condition of the channel such that KN and KP satisfy equation (15).

According to the output buffer circuit of this embodiment, a change in level of each of the address signals A1 to AN is detected by the transition detector circuit 46, so that the capacitor 26 can be charged or discharged prior to reception of readout data from the memory cell, thereby presetting the voltage at the data output terminal OUT to be the VDD/2 level. For this reason, the memory access time TD can, therefore, be shortened. In particular, if the capacitance of the capacitor 26 is large, this effect of shortening the time TD can be emphasized.

One of the n- and p-channel MOS transistors 50 and 52 is rendered conductive in response to the signal generated from the transition detection circuit 46 so as to shift the voltage VOUT at the data output terminal OUT to the VDD/2 level. When the voltage VOUT is set to the VDD/2 level, the MOS transistors 50 and 52 are simultaneously rendered nonconductive, resulting in low power consumption.

It should be noted that the mathematical analysis in the above embodiment is described to disclose the object of the present invention by means of the output buffer circuit. Therefore, even if the conditions described above are not strictly satisifed, the output buffer circuit can be normally operated in practice when these conditions are roughly satisfied.

In this embodiment, transistors 20 and 22 are rendered nonconductive while a preset circuit 48 supplies a charge or discharge current to a capacitor 26. For this reason, a short-circuit current will not flow in the ground terminal from the terminal VD through the transistors 50 and 22 or transistors 20 and 52. If this short-circuit current is present, power consumption increases, and charging and discharging of the capacitor 26 is prevented.

FIG. 6 shows an output buffer circuit according to another embodiment of the present invention. The same reference numerals used in FIG. 6 denote the same parts as in FIG. 3, and a detailed description thereof will be omitted. This output buffer circuit further comprises a 2-input OR gate 63. The first input terminal of the OR gate 63 is connected to a control terminal $\phi$ to which a control signal is supplied, and the second terminal thereof is connected to the output terminal of a transition detector circuit 46. The output terminal of the OR gate 63 is directly connected to the second input terminal of a NOR gate 32 and to the second input terminal of a NAND gate 34 through an inverter 40. In this embodiment, the driver 24 makes the transistors 20, 22 nonconductive in response to one of the signals from the terminal $\phi$ and the transition detector circuit 46. Therefore, it is possible to interrupt the buffer operation of the output buffer circuit, for example, while the memory cells 42-1 to 42-M is in a writing mode.

According to the output buffer circuit of the present invention, the output voltage can be charged at a high speed in accordance with the logic value of the supplied data, and power consumption can be reduced.

It should be noted that the output buffer circuit is not limited to an application for an output of data read out from the semiconductor memory. For example, the transition detector circuit 46 may be connected to receive, instead of the address signals, a signal which simply represents that data will be supplied to the data input terminal IN after a predetermined period of time.

In addition, the p- and n-channel MOS transistors 20 and 22 may be formed of MOS transistors of the same channel.

The driver 24 need not have the latch section.

What is claimed is:

1. An output buffer circuit comprising:
   first and second power source terminals of which the potentials are respectively set at first and second levels;
   a data input terminal for receiving logic data;
   a data output terminal;
   capacitive means which is connected to said data output terminal;
   a first transistor whose current path is connected between said first power source terminal and said data output terminal;
   a second transistor whose current path is connected between said data output terminal and said second power source terminal;
   signal generating means for generating a pulse signal;

a preset circuit comprising first and second switching means and which selectively supplies, in response to the pulse signal from said signal generating means, one of charge and discharge currents to said capacitive means respectively through said first or second switching means to set the potential of said data output terminal at a predetermined level between said first and second levels, said first and second switching means being turned off when the potential of said data output terminal is set at said predetermined level; and drive circuit for controlling conduction states of said first and second transistors in accordance with the logic value of said logic data after the potential of said data output terminal is set at said predetermined level.

2. An output buffer circuit according to claim 1, wherein said signal generating means includes a transition detector circuit for generating the pulse signal in response to the change of an input signal.

3. An output buffer circuit according to claim 2, wherein said transition detector circuit generates the pulse signal having a predetermined pulse width which is not shorter than the period for said preset circuit to change the potential of said data output terminal to said predetermined level.

4. An output buffer circuit according to claim 3, wherein said transition detector circuit includes delay means for delaying said input signal, and an exclusive OR gate circuit having a first input terminal to which said input signal is directly supplied and a second input terminal to which said input signal is supplied through said delay means.

5. An output buffer circuit according to claim 4, wherein said preset circuit includes driving means which turns on one of said first and second switching means in accordance with the potential level at said data output terminal and in response to the pulse signal from said transition detector circuit.

6. An output buffer circuit according to claim 5, wherein said first switching means is an n-channel MOS transistor whose current path is connected between said first power source terminal and said data output terminal and which is rendered conductive as long as the potential of said data output terminal is at a level lower than said predetermined level while said n-channel MOS transistor is being driven by said driving means, and second switching means is a p-channel MOS transistor whose current path is connected between said data output terminal and said second power source terminal and which is rendered conductive as long as the potential of said data output terminal is at a level higher than said predetermined level while said p-channel MOS transistor is being driven by said driving means.

7. An output buffer circuit according to claim 6, wherein said driving means has a line connected between the output terminal of said transition detector circuit and the gate of said n-channel MOS transistor, and an inverter connected between the output terminal of said transition detector circuit and the gate of said p-channel MOS transistor.

8. An output buffer circuit according to claim 7, wherein said drive circuit includes a selector section which makes one of said first and second transistors conductive in accordance with the logic value of said logic data, and which makes each of said first and second transistors nonconductive, regardless of the logic value of said logic data during a period corresponding to the predetermined pulse width of said pulse signal from said transition detector circuit.

9. An output buffer circuit according to claim 8, wherein said first transistor is of p-channel MOS type; said second transistor is of n-channel MOS type; said selector section has a second inverter, a first OR gate circuit whose first and second input terminals are respectively connected to said data input terminal and the output terminal of said transition detector circuit and whose output terminal is connected to a gate of said first transistor; and an AND gate circuit whose second and first input terminals are respectively connected to the output terminal of said transition detector circuit through said second inverter and said data input terminal and whose output terminal is connected to a gate of said second transistor.

10. An output buffer circuit according to claim 9, wherein said drive circuit includes a latch section for holding said logic data supplied from said data input terminal.

11. An output buffer circuit according to claim 10, wherein said drive circuit includes a second OR gate circuit through which the output terminal of said transition detector circuit is connected to the second input of said first OR gate circuit and the input terminal of said second inverter, second OR gate circuit receives a control signal in addition to the pulse signal from said transition detector circuit.

12. An output buffer circuit according to claim 1, wherein said preset circuit includes driving means which turns on one of said first and second switching means in accordance with the potential level at said data output terminal and in response to the pulse signal from said signal generating means.

13. An output buffer circuit according to claim 12, wherein said first switching means is an n-channel MOS transistor whose current path is connected between said first power source terminal and said data output terminal and which is rendered conductive as long as the potential of said data output terminal is at a level lower than said predetermined level while said n-channel MOS transistor is being driven by said driving means, and said second switching means is formed of a p-channel MOS transistor whose current path is connected between said data output terminal and said power source terminal and which is rendered conductive as long as the potential of said data output terminal is at a level higher than said predetermined level while said p-channel MOS transistor is being driven by said driving means.

* * * * *